US006538516B2

(12) United States Patent
Lenk

(10) Patent No.: US 6,538,516 B2
(45) Date of Patent: Mar. 25, 2003

(54) SYSTEM AND METHOD FOR SYNCHRONIZING MULTIPLE PHASE-LOCK LOOPS OR OTHER SYNCHRONIZABLE OSCILLATORS WITHOUT USING A MASTER CLOCK SIGNAL

(75) Inventor: Ronald J. Lenk, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/860,099

(22) Filed: May 17, 2001

(65) Prior Publication Data

US 2002/0171412 A1 Nov. 21, 2002

(51) Int. Cl.[7] .............................. H03L 7/00; H03B 25/00
(52) U.S. Cl. .............................. 331/2; 331/1 A; 331/10; 331/11; 331/46; 331/47; 331/50
(58) Field of Search .................................. 331/2, 10, 11, 331/1 A, 46, 47, 50; 327/141, 144, 147, 156, 159

(56) References Cited

U.S. PATENT DOCUMENTS

| | | | | |
|---|---|---|---|---|
| 3,721,909 A | * | 3/1973 | Pincus | ........................... 327/3 |
| 4,567,448 A | * | 1/1986 | Ikeda | ........................... 331/25 |
| 5,043,677 A | * | 8/1991 | Tomassetti et al. | ............. 331/2 |
| 5,062,105 A | * | 10/1991 | McKnight et al. | ............. 370/84 |
| 5,153,824 A | * | 10/1992 | Lalanne et al. | ............. 364/184 |
| 5,162,652 A | * | 11/1992 | Cohen et al. | ................ 250/288 |
| 5,377,206 A | * | 12/1994 | Smith | ........................... 371/36 |
| 5,422,915 A | * | 6/1995 | Byers et al. | ................. 375/357 |
| 5,463,351 A | * | 10/1995 | Marko et al. | ................ 331/1 A |
| 6,297,702 B1 | * | 1/2000 | Locker et al. | .................. 331/2 |
| 6,229,401 B1 | * | 5/2001 | Wilber | ......................... 331/20 |
| 6,408,008 B1 | * | 6/2002 | Komarek et al. | |

OTHER PUBLICATIONS

Linear Technology Corporation, *PolyPhase, High Efficiency, Synchronous Step-Down Switching Regulator*, Initial Release Final Electrical Specifications LTC1629, Aug. 1999; pp. 1–24.

* cited by examiner

*Primary Examiner*—N. Le
*Assistant Examiner*—Wasseem H. Hamdan
(74) *Attorney, Agent, or Firm*—Skjerven Morrill LLP

(57) ABSTRACT

A system and method for synchronizing a plurality of synchronizable oscillators are disclosed. The method includes monitoring a respective output signal of each synchronizable oscillator, each output signal having a respective frequency, generating a synchronization signal based on the output signal having the highest frequency of all of the output signals, and providing the synchronization signal to all of the synchronizable oscillators.

19 Claims, 3 Drawing Sheets

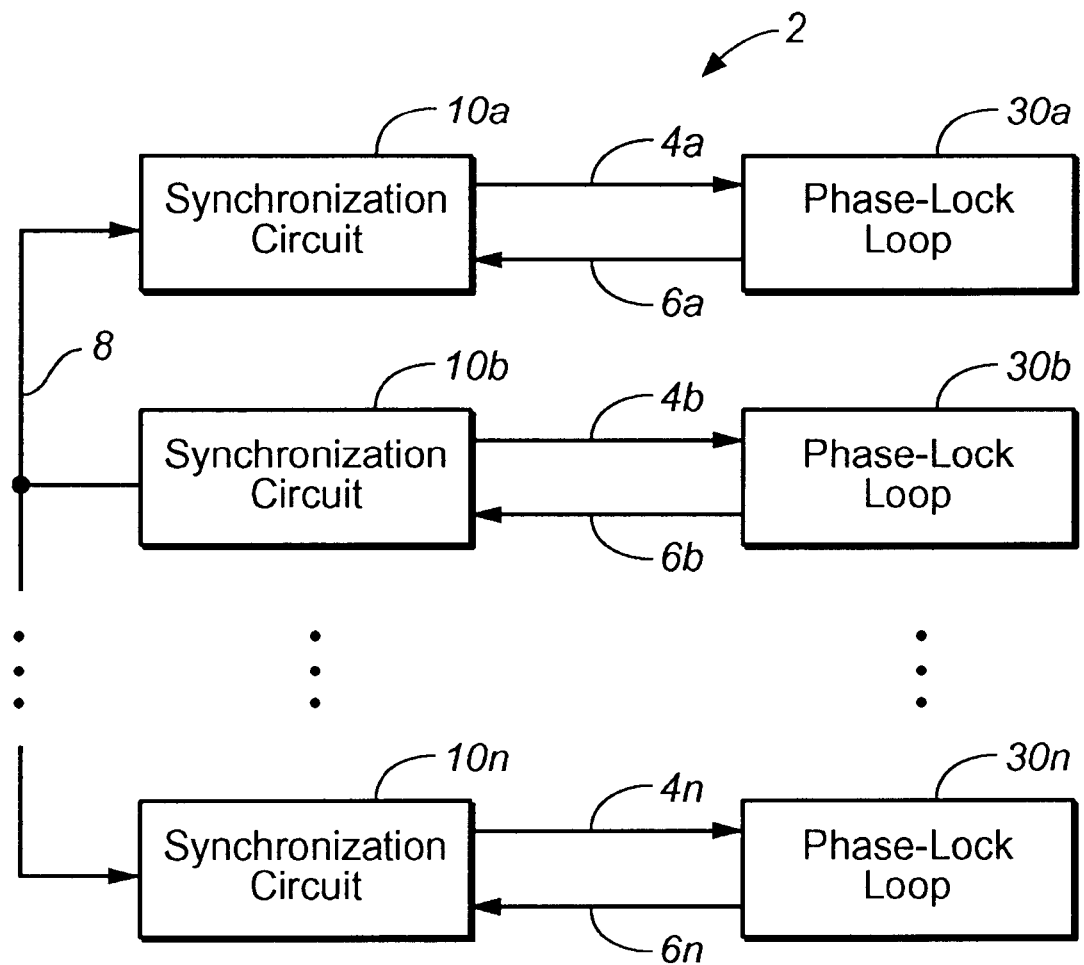
FIG._1

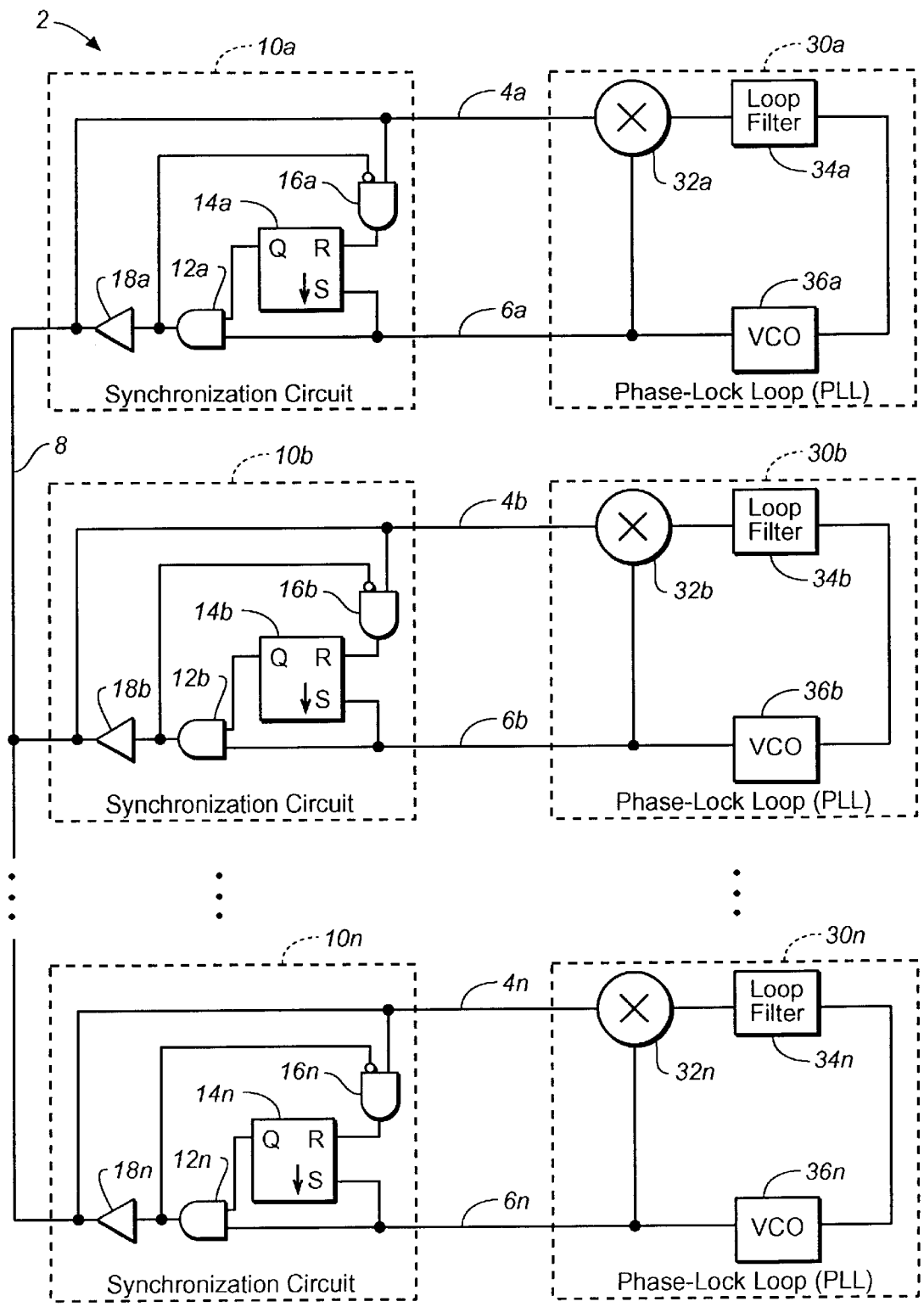
FIG._2

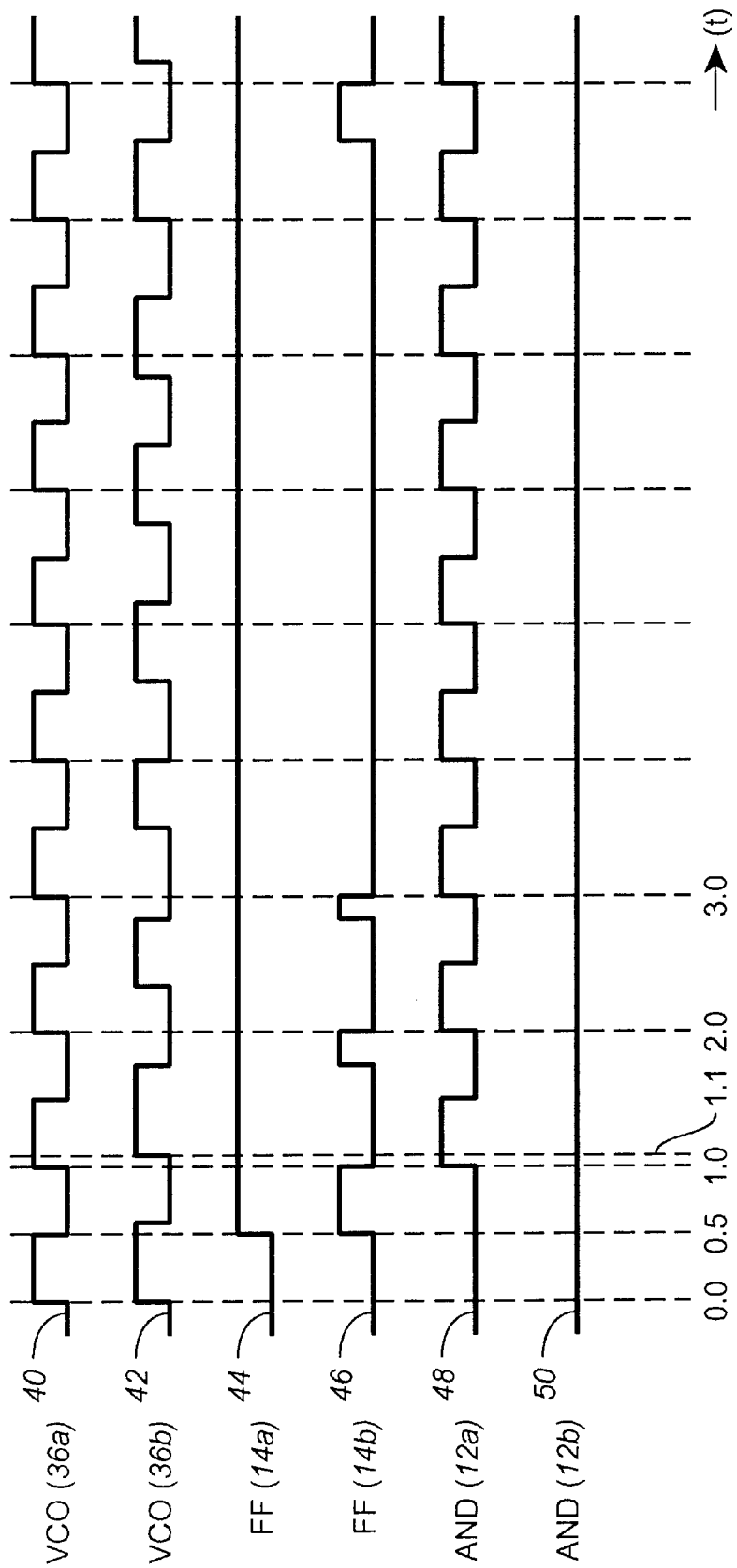
FIG._3

SYSTEM AND METHOD FOR SYNCHRONIZING MULTIPLE PHASE-LOCK LOOPS OR OTHER SYNCHRONIZABLE OSCILLATORS WITHOUT USING A MASTER CLOCK SIGNAL

BACKGROUND OF THE INVENTION

1. Field of the Invention

The present invention relates to a system and method for synchronizing multiple phase-lock loops or other synchronizable oscillators without using a master clock signal.

2. Related Art

Many systems use synchronizable oscillators such as phase-lock loops (PLLs). In these systems, it is often desirable or necessary to synchronize the synchronizable oscillators. Synchronization of the synchronizable oscillators ensures that each synchronizable oscillator in a given system is operating at the same frequency.

An example of such a system is one in which multiple switching power supplies or converters are connected in parallel to provide a high current output (e.g., 15 to 200 A). Each converter in the system includes a PLL that sets the switching frequency of that converter's switches. Since each PLL in the system typically operates at a different free running frequency, the switching frequency of each converter's switches is different. This is undesirable because if the frequencies are close together, there will be low frequency beating at both the input and output degrading the performance of the power supply.

One conventional technique for synchronizing multiple PLLs is to have a predesignated master PLL provide a master clock signal to one or more slave PLLs. The slave PLLs can then lock to the master clock signal and thus operate at the same frequency as that of the master PLL. A limitation of this technique is that it is not fault tolerant. If the master PLL malfunctions or fails, the slave PLLs will operate at their free running frequencies, which are typically different. Thus, the PLLs will not be synchronized.

Accordingly, what is needed is a system and method for synchronizing multiple phase-lock loops or other synchronizable oscillators without using a master clock signal.

SUMMARY OF THE INVENTION

The present invention overcomes the disadvantages and limitations described above by providing a system and method for synchronizing multiple phase-lock loops or other synchronizable oscillators without using a master clock signal.

In one embodiment of the present invention, a method for synchronizing a plurality of synchronizable oscillators is provided. The method includes monitoring a respective output signal of each synchronizable oscillator, each output signal having a respective frequency, generating a synchronization signal based on the output signal having the highest frequency of all of the output signals, and providing the synchronization signal to all of the synchronizable oscillators.

In another embodiment of the present invention, a method for synchronizing a first synchronizable oscillator and a second synchronizable oscillator is provided. The method includes generating a first synchronization signal at a first synchronization circuit if the first synchronizable oscillator generates a first output signal before the second synchronizable oscillator generates a second output signal.

In another embodiment of the present invention, a system for synchronizing a first synchronizable oscillator and a second synchronizable oscillator is provided. The system includes a first synchronization circuit coupled to the first synchronizable oscillator, and a second synchronization circuit coupled to the second synchronizable oscillator. The first synchronization circuit is operable to generate a first synchronization signal if the first synchronizable oscillator generates a first output signal before the second synchronizable oscillator generates a second output signal.

In another embodiment of the present invention, a system is provided. The system includes a plurality of synchronizable oscillator, each synchronizable oscillator operating at a respective frequency, and synchronization means for synchronizing the plurality of synchronizable oscillators, the synchronization means operable to cause the plurality of synchronizable oscillators to operate at a frequency corresponding to the frequency of the synchronizable oscillator that is operating at the highest frequency.

In another embodiment of the present invention, a system is provided. The system includes a plurality of synchronizable oscillators, each synchronizable oscillator operable to generate a respective output signal, each output signal having a respective frequency, and a plurality of synchronization circuits, each synchronization circuit connected to a respective synchronizable oscillator and operable to generate a synchronization signal.

Other embodiments, aspects, and advantages of the present invention will become apparent from the following descriptions, the accompanying drawings, and the accompanying claims.

BRIEF DESCRIPTION OF THE DRAWINGS

For a more complete understanding of the present invention and for further embodiments, aspects, and advantages, reference is now made to the following description taken in conjunction with the accompanying drawings, in which:

FIG. 1 is a block diagram of an exemplary system for synchronizing multiple phase-lock loops, according to some embodiments of the present invention.

FIG. 2 is a partial block diagram of an exemplary system for synchronizing multiple phase-lock loops, according to some embodiments of the present invention.

FIG. 3 is a timing diagram illustrating the operation of the exemplary system of FIG. 2, according to some embodiments of the present invention.

DETAILED DESCRIPTION OF THE INVENTION

The preferred embodiments of the present invention and their advantages are best understood by referring to FIGS. 1 through 3 of the drawings. Like numerals are used for like and corresponding parts of the various drawings. FIGS. 1 through 3 describe systems and methods for synchronizing multiple PLLs, however, those of ordinary skill in the art will recognize that the systems and methods can be used to synchronize any type of synchronizable oscillator. As used herein, the term "synchronizable oscillator" refers to any type of oscillator or oscillator circuit that is capable of being synchronized with a reference signal.

FIG. 1 is a block diagram of an exemplary system 2 for synchronizing multiple PLLs 30, according to some embodiments of the present invention. System 2 includes a plurality of synchronization circuits 10 (separately labeled 10a, 10b, ..., 10n) coupled to one another by a synchronization bus 8, and a plurality of PLLs 30 (separately labeled 30a, 30b, ..., 30n) coupled to respective synchronization circuits 10 by respective input lines 4 (separately labeled 4a, 4b, ..., 4n) and output lines 6 (separately labeled 6a, 6b, ..., 6n).

In system 2, the plurality of PLLs 30 are synchronized without requiring any one of the PLLs 30 to be pre-designated as a master PLL. In operation, synchronization circuits 10 work together to ensure that each of PLLs 30 operate at the same frequency by cooperatively monitoring each PLL 30 and determining which PLL 30 is operating at the highest frequency. The PLL operating at the highest frequency in system 2 will be referred to herein as the controlling PLL and all of the other PLLs in system 2 will be collectively referred to herein as the non-controlling PLLs.

Once the controlling PLL has been identified, the synchronization circuit 10 connected to the controlling PLL outputs a synchronization signal. The synchronization signal can be provided to the other synchronization circuits 10 and/or PLLs 30 via synchronization bus 8. The frequency of the synchronization signal corresponds to or is representative of the frequency of the controlling PLL 30. In some embodiments, the frequency of the synchronization signal is equal to, or substantially equal to, the frequency of the controlling PLL. Each non-controlling PLL 30 then locks onto the frequency of the synchronization signal. Additionally, the synchronization signal causes the outputs (to synchronization bus 8) of non-controlling PLLs respective synchronization circuits 10 to be suppressed. As a result, all of the non-controlling PLLs 30 in system 2 become synchronized with the frequency of the controlling PLL 30.

If the controlling PLL malfunctions or fails, the outputs (to synchronization bus 8) of the non-controlling PLLs respective synchronization circuits 10 are no longer suppressed by the synchronization signal generated by the controlling PLL's synchronization circuit 10. As a result, the remaining PLL 30 that is operating at the next highest frequency then becomes the controlling PLL 30 for system 2 and all of the other remaining PLLs 30 are synchronized with the frequency of this new controlling PLL 30 via synchronization circuits 10. Consequently, system 2 is fault tolerant.

Synchronization circuits 10 can include any circuit or combination of circuits that allow system 2 to operate in the manner described above. PLLs 30 can include any circuit or combination of circuits that function as a PLL. For example, PLLs 30 can include a voltage controlled oscillator, a multiplying device, and a loop filter. Synchronization bus 8 can be a hard-wired connection, a wireless connection, or a combination thereof.

In some embodiments, synchronization circuits 10 can be implemented on a single integrated circuit device or on multiple integrated circuit devices that are coupled to one another via synchronization bus 8. Likewise, PLLs 30 can be implemented on a single integrated circuit device or on multiple integrated circuit devices. Synchronization circuits 10 can also be implemented on the same integrated circuit device as their respective PLLs 30, or synchronization circuits 10 and PLLs 30 can be implemented on different integrated circuit devices. The phase-shift of each PLL 30 can be set using known techniques. For example, the non-controlling PLLs 30 can be set by having the controlling PLL distribute phase-shifted synchronization signals to the non-controlling PLLs. The non-controlling PLLs 30 can also be programmed to shift the phase of the synchronization signal.

FIG. 2 is a detailed block diagram of an exemplary system 2 for synchronizing multiple PLLs 30, according to some embodiments of the present invention. In particular, FIG. 2 shows exemplary circuit implementations for synchronization circuits 10 and PLLs 30. Those of ordinary skill in the art will recognize that the circuit shown and described in FIG. 2 is only one of a wide variety of circuits that can be used to implement the present invention and that all other circuits are within the scope of the present invention.

Synchronization circuits 10 are coupled to respective PLLs 30 via respective input lines 4 (separately labeled 4a, 4b, ..., 4n) and output lines 6 (separately labeled 6a, 6b, ..., 6n). Synchronization circuits 10 are coupled to one another by synchronization bus 8.

Each synchronization circuit 10 includes a first AND gate 12 (separately labeled 12a, 12b, ..., 12n), a set-reset (SR) flip-flop 14 (separately labeled 14a, 14b, ..., 14n), a second AND gate 16 (separately labeled 16a, 16b, ..., 16n), and a buffer 18 (separately labeled 18a, 18b, ..., 18n). The SET inputs of SR flip-flops 14 are falling edge triggered. Thus, a SR flip-flop 14 is set when the signal applied to the SET input terminal transitions from a logic high level to a logic low level. In contrast, the RESET inputs of SR flip-flops 14 are high level triggered. Thus, SR flip-flops 14 reset and remain reset when the signal applied to the RESET input terminal is logic high.

For each synchronization circuit 10, the SET input terminal of SR flip-flop 14 is connected to an output line 6. The RESET input terminal of SR flip-flop 14 is connected to the output terminal of AND gate 16. One input terminal of AND gate 12 is connected to output line 6. Another input terminal of AND gate 12 is connected to the Q output terminal of SR flip-flop 14. The input terminal of buffer 18 is connected to the output terminal of AND gate 12. The non-inverting input terminal of AND gate 16 is connected to input line 4 which is also commonly connected to the output terminal of buffer 18 and synchronization bus 8. The inverting input terminal of AND gate 16 is connected to the output terminal of AND gate 12.

PLLs 30 include multipliers 32 (separately labeled 32a, 32b, ..., 32n), loop filters 34 (separately labeled 34a, 34b, ..., 34n), and voltage controlled oscillators (VCOs) 36 (separately labeled 36a, 36b, ..., 36n).

For each PLL 30, one input terminal of multiplier 32 is connected to input line 4. Another input terminal of multiplier 32 is connected to the output terminal of VCO 36 that is also commonly connected to output line 6. The input terminal of loop filter 34 is connected to the output terminal of multiplier 32. The input terminal of VCO 36 is connected to the output terminal of loop filter 34.

The operation of system 2 is now described with reference to FIG. 2 and an associated timing diagram shown in FIG. 3. For clarity and ease of description, several simplifications have been made. First, only the operation of PLL 30a and its respective synchronization circuit 10a and PLL 30b and its respective synchronization circuit 10b are discussed. Second, propagation delays are ignored. Third, it is assumed that PLL 30a and PLL 30b are initially in phase. Fourth, it is assumed that PLL 30a initially operates at a higher frequency than PLL 30b (i.e., PLL 30a has a higher free running frequency than PLL 30b). Those of ordinary skill in the art will recognize that these simplifications are not material to the operation of system 2 and have been made solely for clarity and ease of description.

In FIG. 3, the output signal of VCO 36a is shown as waveform 40, the output signal of VCO 36b is shown as waveform 42, the output signal of SR flip-flop 14a is shown as waveform 44, the output signal of SR flip-flop 14b is shown as waveform 46, the output signal of AND gate 12a is shown as waveform 48, and the output signal of AND gate 12b is shown as waveform 50.

At time t=0.0, VCO 36a and VCO 36b each generate a respective first pulse. At time t=0.5, the falling edge of the first pulse from VCO 36a sets SR flip-flop 14a, thus producing a logic high signal at the Q output terminal of SR flip-flop 14a. At this time, the signal output by AND gate 12a is logic low since the output signal of VCO 36a is logic low.

At time t=0.55, the falling edge of the first pulse from VCO 36b sets SR flip-flop 14b, thus producing a logic high signal at the Q output terminal of SR flip-flop 14b. At this time, the signal output by AND gate 12b is logic low since the output signal of VCO 36b is logic low.

At time t=1.0, VCO 36a generates a second pulse. The second pulse from VCO 36a reaches the input terminal of AND gate 12a and, since the Q output signal of SR flip-flop 14a is a logic high, the second pulse from VCO 36a propagates through AND gate 12a (i.e., a logic high signal is produced at the output terminal of AND gate 12a). The logic high signal that is output by AND gate 12a is then output to the inverting input terminal of AND gate 16a. The logic high signal that is output by AND gate 12a is also output to buffer 18a. Buffer 18a buffers the logic high signal output by AND gate 12a and produces a logic high signal output on synchronization bus 8. The signal output to synchronization bus 8 is referred to herein as the synchronization signal.

Meanwhile, VCO 36b has not yet produced a second pulse (i.e., t<1.1) since the free running frequency of VCO 36b is less than the free running frequency of VCO 36a. Thus, the synchronization signal (i.e., the logic high signal on synchronization bus 8 that was produced by VCO 36a) reaches the non-inverting input of AND gate 16b and, since the inverting input of the AND gate is a logic low signal, a logic high signal is produced at the output terminal of AND gate 16b. The logic high signal produced at the output of AND gate 16b resets SR flip-flop 14b producing a logic low signal at output Q of SR flip-flop 14b.

At time t=1.1, VCO 36b generates a second pulse. The second pulse from VCO 36b reaches the input terminal of AND gate 12b, but since the Q output signal of SR flip-flop 14b is a logic low signal, the second pulse from VCO 36b does not propagate through AND gate 12b (i.e., the signal output by AND gate 12b remains logic low). Thus, because the second pulse produced by VCO 36a reaches AND gate 16b and causes SR flip-flop 14b to be reset before the second pulse produced by VCO 36b reaches AND gate 12b, the second pulse produced by VCO 36b is prevented from reaching synchronization bus 8.

The synchronization method described above repeats indefinitely as shown in the timing diagram of FIG. 3. The pulses generated by VCO 36a continue to propagate through AND gate 12a and buffer 18a, continuously causing SR flip-flop 14b to be reset, and thus preventing the pulses generated by VCO 36b from reaching synchronization bus 8. At the same time, SR flip-flop 14a remains set since the inverting and non-inverting input terminals of AND gate 16a are always driven by the same signal (i.e., the output of VCO 36a). As a result, the output signal of VCO 36a is output to synchronization bus 8 at all times and is used as the synchronization signal. The synchronization signal is then distributed via synchronization bus 8 (and input lines 4a and 4b) to multipliers 32a and 32b causing PLLs 30a and 30b to lock to the frequency of the synchronization signal. Thus, PLL 30a and PLL 30b are synchronized without pre-designating either PLL as a master PLL.

Several points should be noted in regard to the synchronization system and method described with reference to FIGS. 2 and 3 above. First, a plurality of PLLs 30 can be connected together (rather than two) and each PLL 30 can become synchronized with the PLL 30 operating at the highest frequency. Second, the synchronization method and circuit described above can be modified such that the PLL 30 operating at the lowest frequency can output the synchronization signal to synchronization bus 8 and that each of the other PLLs 30 can then lock to the frequency of the PLL operating at the lowest frequency. Third, harmonic locking can be prevented by limiting the frequency range of each VCO 36 and the tolerance on the free-running frequency of each VCO 36 should be tighter than the lock or pull-in range of each PLL 30.

While particular embodiments of the present invention and their advantages have been shown and described, it should be understood that various changes, substitutions, and alterations can be made therein without departing from the spirit and scope of the invention as defined by the appended claims. It should also be understood that the synchronization system and method of the present invention can be implemented in any application that requires synchronization of multiple phase-lock loops or other synchronizable oscillators, such as applications where multiple controllers are connected in parallel to supply a high load current, in telecommunications systems, in radar systems, and in space communications systems.

What is claimed is:

1. A method for synchronizing a plurality of synchronizable oscillators, the method comprising:

monitoring a respective output signal of each synchronizable oscillator, each output signal having a respective frequency;

generating a synchronization signal based on the output signal having the highest frequency of all of the output signals;

providing the synchronization signal to all of the synchronizable oscillators; and synchronizing the plurality of synchronizable oscillators using the synchronization signal and without a master clock signal.

2. The method of claim 1 wherein each synchronizable oscillator is a phase-lock loop.

3. The method of claim 1 wherein each synchronizable oscillator includes a voltage controlled oscillator which generates the respective output signal.

4. The method of claim 1 wherein the synchronization signal has a frequency which is substantially equal to the frequency of the output signal having the highest output frequency.

5. A system comprising:

a plurality of synchronizable oscillators, each synchronizable oscillator operating at a respective frequency; and synchronization means for synchronizing the plurality of synchronizable oscillators without a master clock signal, the synchronization means operable to cause the plurality of synchronizable oscillator to operate at a frequency corresponding to the frequency of the synchronizable oscillator that is operating at the highest frequency.

6. The system of claim 5 wherein each synchronizable oscillator comprises a phase-lock loop.

7. The system of claim 5 wherein each synchronizable oscillator comprises a voltage controlled oscillator.

8. A system comprising:
- a plurality of synchronizable oscillators, each synchronizable oscillator operable to generate a respective output signal, each output signal having a respective frequency; and
- a plurality of synchronization circuits, each synchronization circuit connected to a respective synchronizable oscillator and operable to generate a synchronization signal if the output signal generated by the respective synchronizable oscillator has the highest frequency, wherein the synchronization signal is used for synchronizing the plurality of synchronizable oscillators without a master clock signal.

9. The system of claim 1 wherein the synchronization signal is provided to all of the synchronizable oscillators.

10. The system of claim 8 wherein the synchronization signal is provided to all of the synchronization circuits.

11. The system of claim 8 wherein the synchronization signal has a frequency which is substantially equal to the frequency of the output signal having the highest output frequency.

12. The system of claim 8 wherein each synchronizable oscillator comprises a phase-lock loop.

13. The system of claim 8 wherein each synchronizable oscillator comprises a voltage controlled oscillator.

14. A system for synchronizing a first synchronizable oscillator and a second synchronizable oscillator, the system comprising:
- a first synchronization circuit associated with and coupled to the first synchronizable oscillator; and
- a second synchronization circuit associated with and coupled to the second synchronizable oscillator;
- wherein each of the first and second synchronization circuits is operable to generate a synchronization signal if the associated synchronizable oscillator generates a first output signal before the synchronizable oscillator associated with the other of the first and second synchronization circuits generates a second output signal, and wherein the synchronization signal is used for synchronizing the first and second synchronizable oscillators without a master clock signal.

15. The system of claim 14 wherein the first synchronizable oscillator and the second synchronizable oscillator each comprises a phase-lock loop.

16. The system of claim 14 wherein the first synchronizable oscillator and the second synchronizable oscillator each comprises a voltage controlled oscillator.

17. A system comprising:
- a plurality of synchronizable oscillators, each synchronizable oscillator operable to generate a respective output signal, each output signal having a respective frequency, wherein none of the synchronizable oscillators is pre-designated as a master oscillator for providing a master clock signal; and
- a plurality of synchronization circuits, each synchronization circuit connected to and associated with a respective synchronizable oscillator and operable to generate a synchronization signal under a pre-determined condition, wherein the synchronization signal is used for synchronizing the plurality of synchronizable oscillators.

18. The system of claim 17 wherein the pre-determined condition comprises the associated synchronizable oscillator generating the output signal with the highest frequency.

19. The system of claim 17 wherein the pre-determined condition comprises the associated synchronizable oscillator generating the output signal with the lowest frequency.

* * * * *